United States Patent
Hsiung et al.

(10) Patent No.: US 7,782,095 B2
(45) Date of Patent: Aug. 24, 2010

(54) SIGNAL COMPARISON CIRCUIT

(75) Inventors: Wen-Ching Hsiung, Hsinchu (TW);
Chia-Liang Lai, Changhua County
(TW); Kuan-Yu Chen, Hsinchu (TW);
Jeng-Dau Chang, Tainan County (TW)

(73) Assignee: Faraday Technology Corp.,
Science-Based Industrial Park, Hsin-Chu
(TW)

( * ) Notice: Subject to any disclaimer, the term of this patent is extended or adjusted under 35 U.S.C. 154(b) by 0 days.

(21) Appl. No.: 11/945,053

(22) Filed: Nov. 26, 2007

(65) Prior Publication Data

US 2009/0134913 A1 May 28, 2009

(51) Int. Cl.
*H03K 5/153* (2006.01)

(52) U.S. Cl. .......................................... 327/72; 327/77

(58) Field of Classification Search .................. 327/72, 327/77
See application file for complete search history.

(56) References Cited

U.S. PATENT DOCUMENTS

| | | | | |
|---|---|---|---|---|
| 4,472,799 A * | 9/1984 | Fossati et al. ................ | 370/294 |
| 4,520,324 A * | 5/1985 | Jett et al. ..................... | 330/285 |
| 4,641,324 A * | 2/1987 | Karsh et al. .................. | 375/317 |
| 5,041,926 A * | 8/1991 | Ockerse et al. ........... | 360/77.05 |
| 5,315,164 A * | 5/1994 | Broughton .................. | 327/175 |
| 5,371,763 A * | 12/1994 | Ota et al. ..................... | 375/319 |
| 5,612,810 A * | 3/1997 | Inami et al. .................. | 398/202 |
| 5,892,609 A * | 4/1999 | Saruwatari .................. | 398/202 |
| 6,041,084 A * | 3/2000 | Nagaraj ....................... | 375/317 |
| 6,151,150 A * | 11/2000 | Kikuchi ....................... | 398/209 |
| 6,201,419 B1 * | 3/2001 | Kamei ......................... | 327/77 |
| 6,249,824 B1 * | 6/2001 | Henrichs ....................... | 710/8 |
| 6,671,075 B1 * | 12/2003 | Mizunaga ................... | 398/202 |
| 6,888,381 B2 * | 5/2005 | Momtaz et al. ............... | 327/58 |
| 6,965,257 B2 * | 11/2005 | Tanaka ........................ | 327/58 |
| 6,982,596 B2 * | 1/2006 | Kumeta et al. .............. | 330/253 |
| 7,098,737 B2 * | 8/2006 | Fujimoto et al. ............ | 330/283 |
| 7,136,772 B2 * | 11/2006 | Duchi et al. ................. | 702/118 |
| 7,215,196 B2 * | 5/2007 | Banba et al. ................. | 330/254 |
| 7,292,101 B2 * | 11/2007 | Kocaman et al. ............ | 330/254 |
| 7,295,068 B2 * | 11/2007 | Capofreddi et al. ......... | 330/254 |
| 7,348,808 B2 * | 3/2008 | Moussavi .................... | 327/77 |
| 7,518,452 B2 * | 4/2009 | Imai ............................ | 330/254 |
| 7,521,997 B2 * | 4/2009 | Beck et al. .................. | 330/254 |

(Continued)

OTHER PUBLICATIONS

Jinghua Li, Jose Silva-Martinez, Brian Brunn, Shahriar Rokhsaz and Moises E. Robinson, "A Full On-Chip CMOS Clock Data Recovery IC for OC-I92 Applications", Jun. 2008, IEEE, vol. 55, No. 5, pp. 1213-1222.*

*Primary Examiner*—Lincoln Donovan
*Assistant Examiner*—Adam D Houston
(74) *Attorney, Agent, or Firm*—Winston Hsu

(57) ABSTRACT

A signal comparison circuit is provided. The signal comparison circuit includes a first amplifier, a second amplifier, a peak detector, and a comparator. The first amplifier is a zero-peaking amplifier. The first amplifier receives and amplifies a data signal. The second amplifier receives and amplifies a reference voltage. The peak detector is coupled to the first and the second amplifiers for detecting and maintaining maximum values of the amplified data signal and the amplified reference voltage, and then outputting the maintained data signal and the maintained reference voltage. The comparator is coupled to the peak detector for comparing the maintained data signal with the maintained reference voltage and outputting a result of the comparison.

13 Claims, 5 Drawing Sheets

U.S. PATENT DOCUMENTS

| | | | |
|---|---|---|---|
| 2004/0091032 A1* | 5/2004 | Duchi et al. | 375/224 |
| 2005/0194996 A1* | 9/2005 | Moran et al. | 327/60 |
| 2006/0140262 A1* | 6/2006 | Kuijk et al. | 375/232 |
| 2006/0244530 A1* | 11/2006 | Kocaman et al. | 330/254 |
| 2006/0255860 A1* | 11/2006 | Moussavi | 330/278 |
| 2008/0024175 A1* | 1/2008 | Carrara et al. | 327/77 |
| 2008/0143439 A1* | 6/2008 | Tanimoto et al. | 330/253 |

* cited by examiner

SIGNAL COMPARISON CIRCUIT

BACKGROUND OF THE INVENTION

1. Field of the Invention

The present invention generally relates to a signal comparison circuit, and particularly, to a comparison circuit for not-return-to-zero (NRZ) data signal.

2. Description of Related Art

A comparator is often employed by a high speed serial system for detecting amplitude of inputted signals. The comparator compares the data signals with a predetermined threshold or a reference voltage, wherein signals which are too small are identified as of poor quality and are neglected, and only those qualified by the comparator selection can be received.

FIG. 1 describes a typical NRZ data signal 100. The signal 100 has two statuses, logic 1 and logic 0. When the status remains unchanged, the data transmitted thereby is logic 0, which is shown in the direct current (DC) part in FIG. 1. When the status changes, the data transmitted thereby is logic 1, which is shown in the Alternating current (AC) part.

Such a high speed serial system is featured as being capable of changing status with an extreme high frequency. As shown in FIG. 1, when a signal 100 is a direct current signal, it has a frequency of 0 Hz, and when the signal 100 is an alternating current signal, it has a frequency of 2.5 GHz. A conventional comparator if employed thereby cannot immediately enhance the operation frequency from 0 to 2.5 GHz, and is incapable of sustain the high speed operation at 2.5 GHz.

In order to solve the aforementioned problem, some other conventional comparators increase frequency bandwidth by increasing current with a current comparing method. However, this method often causes misjudgement when the data signals are changed between logic 1 and logic 0.

Another proposed solution is employing a peak detector in front of the comparator for detecting and sustaining a maximum value of the data signals. A typical peak detector includes a circuit as shown in FIG. 2, wherein Vin represents an input signal, and Vo represents an output signal. After passing through the peak detector, the data signal declines to a low frequency signal, which can be conveniently processed by the conventional comparators.

Unfortunately, the peak detector requires a current leakage path for discharging charges from a peak detecting capacitor, and only after the charges are discharged, amplitudes of next input data can be compared. When the alternating current data signal changes status, an output voltage of the peak detector will decrease due to the discharging system, thus causing misjudgement.

In summary, conventional comparators have limited operable frequency bandwidth. However, current mode comparators are likely to cause misjudgements when changing status. Further, if employing a peak detector, there raises a problem of voltage droop when comparing alternating current signals. It becomes a major concern to provide an ideal solution.

SUMMARY OF THE INVENTION

Accordingly, the present invention is directed to a signal comparison circuit for solve the above-mentioned problem, i.e., misjudgement related to current mode comparator and voltage droop caused by peak detector.

The present invention further provides signal comparison circuit. The signal comparison circuit includes a first amplifier, a second amplifier, a peak detector, and a comparator. The first amplifier is a zero-peaking amplifier, adapted for receiving and amplifying a data signal. The second amplifier receives and amplifiers a reference voltage. The peak detector is coupled to the first amplifier and the second amplifier. The peak detector is adapted for detecting and maintaining a maximum value of the amplified data signal and the reference voltage. The comparator is coupled to the peak detector for comparing the maintained data signal and the reference voltage, and outputting a comparison result. The comparator features in delaying comparison.

In an embodiment according to the present invention, the peak detector includes a capacitor for maintaining the maximum value of the amplified data signal and the reference voltage, and a full wave rectifier structure which is functional to both of a positive semi-cycle and a negative semi-cycle of a differential signal.

Comparing with the conventional, the present invention does not employ the current mode comparator, and therefore does not cause any misjudgement when changing status of the data signal. The zero-peaking amplifier generates relatively large gain for alternating current data signals for compensating voltage droop caused by the peak detector. The peak detector according to the present invention is designed with a full wave rectifier, so as to be capable of comparing both of the positive semi-cycle and the negative semi-cycle of the differential signal. According to the present invention, a path of a direct current data signal and a path of the reference voltage are completely symmetrical configured. As such, the present invention is accurate in comparing direct current data signals. In another hand, the present invention would not cause misjudgement when comparing alternating current data signals.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
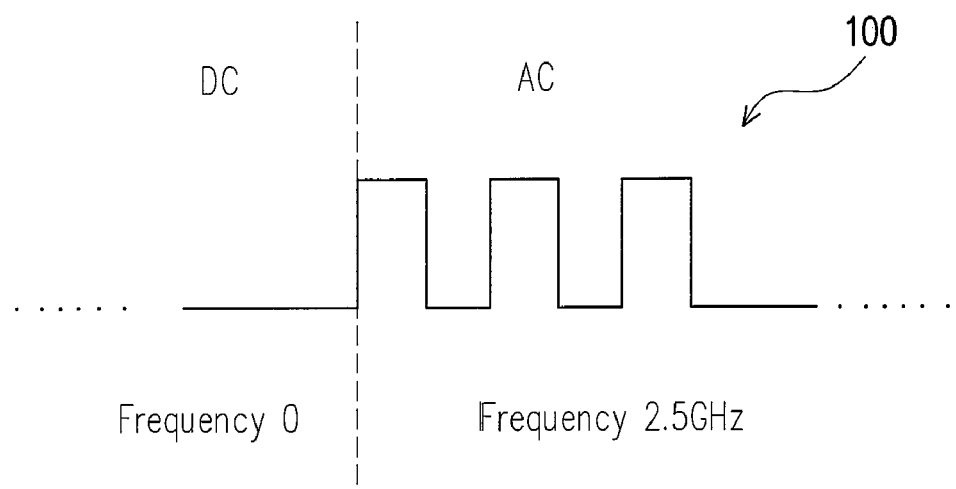
FIG. 1 is a schematic diagram illustrating a conventional not-return-to-zero (NRZ) data signal.

Reference will now be made in detail to the present preferred embodiments of the invention, examples of which are illustrated in the accompanying drawings. Wherever possible, the same reference numbers are used in the drawings and the description to refer to the same or like parts.

Figure 3:
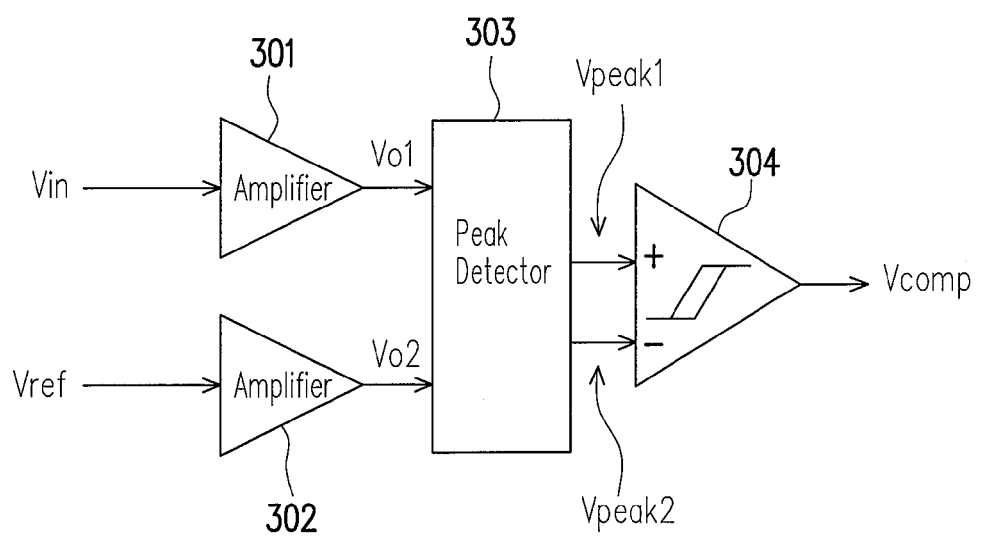
FIG. 3 illustrates a signal comparison circuit according to an embodiment of the present invention.

FIG. 3 illustrates a signal comparison circuit 300 according to an embodiment of the present invention. The signal comparison circuit 300 is adapted for detecting a quality of an NRZ data signal Vin. The signal comparison circuit 300 includes amplifiers 301, 302, a peak detector 303, and comparator 304. The amplifier 301 receives and amplifiers the NRZ data signal Vin. The amplifier 302 receives and amplifies a reference voltage Vref. The peak detector 303 is coupled to the amplifiers 301 and 302 for detecting and maintaining maximum values of amplified data signal Vo1 and amplified reference voltage Vo2, and thereafter outputting the maintained data signal Vpeak1 and the maintained reference voltage Vpeak2. The comparator 304 is coupled to the peak detector 303, for comparing the maintained data signal Vpeak1 with the maintained reference voltage Vpeak2, and outputting a comparison result Vcomp as a quality index of the signal.

Figure 4A:
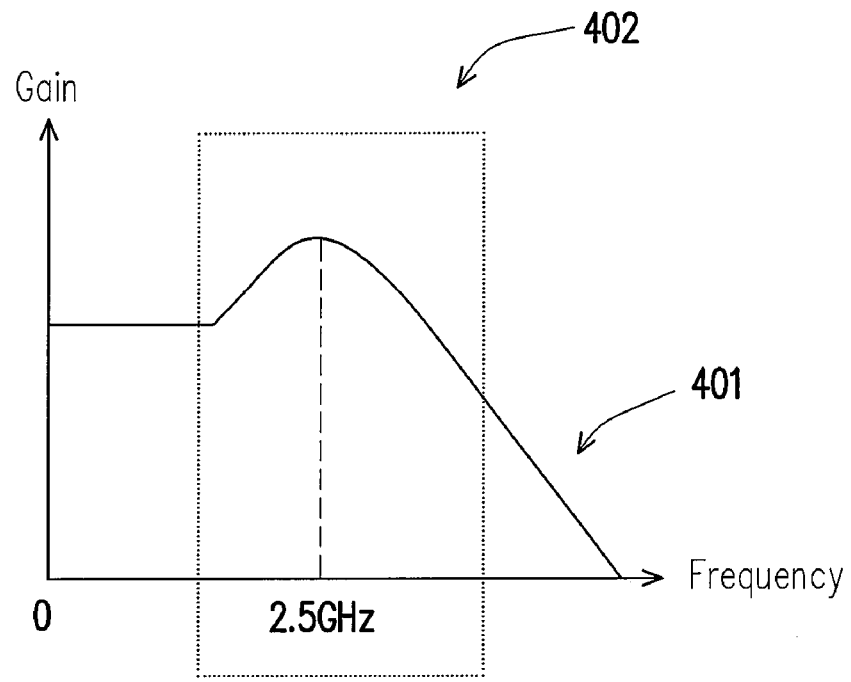
FIG. 4A is a gain curve of a zero-peaking amplifier of the signal comparison circuit as shown in FIG. 3.
Figure 4B:
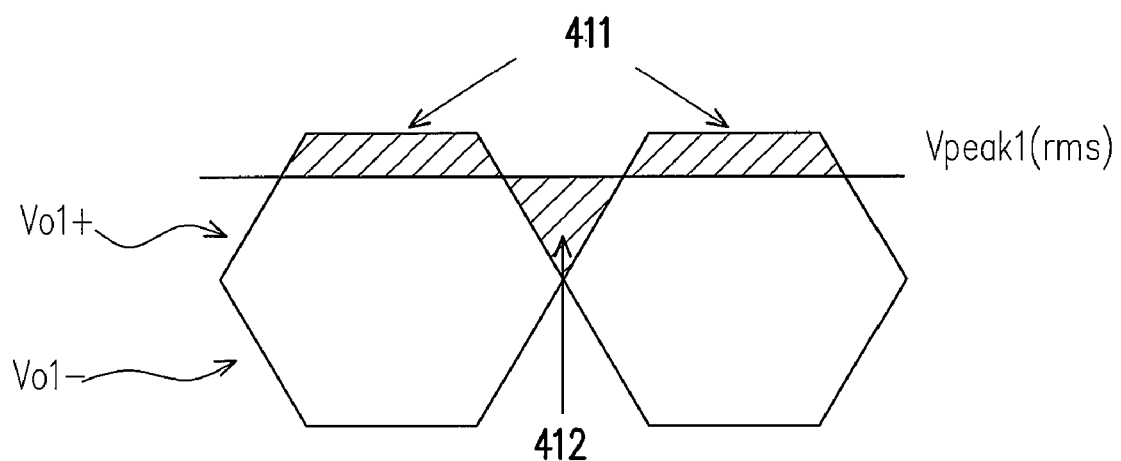
FIG. 4B illustrates an output voltage of the peak detector of FIG. 3.

It should be noted that the amplifier 301 is not a common one. It is a zero-peaking amplifier, whose gain curve is shown in FIG. 4A. Referring to FIG. 4A, the gain 401 of the amplifier 301 increases drastically in a high frequency band 402, and achieves the maximum gain at 2.5 GHz, which is the data transmission rate of the data signal Vin. This is the specific feature of the zero-peaking amplifier. FIG. 4B illustrates the root-mean-square (rms) value of an output voltage Vpeak1 of the peak detector 303. Here the amplified data signal Vo1 is a differential signal and Vo1+ and Vo1− are the different component signals of Vo1. In a conventional circuit, when Vin changes status, Vo1 changes status with Vin and a decrease as described by 412 occurs, which may cause misjudgement of the comparator. The enhanced gain of the amplifier 301 in the high frequency band 402 boosts Vpeak1 as described by 411 for compensating a voltage droop as described by 412, thus preventing the comparator 304 from misjudging the quality of the data signal Vin.

Figure 5:
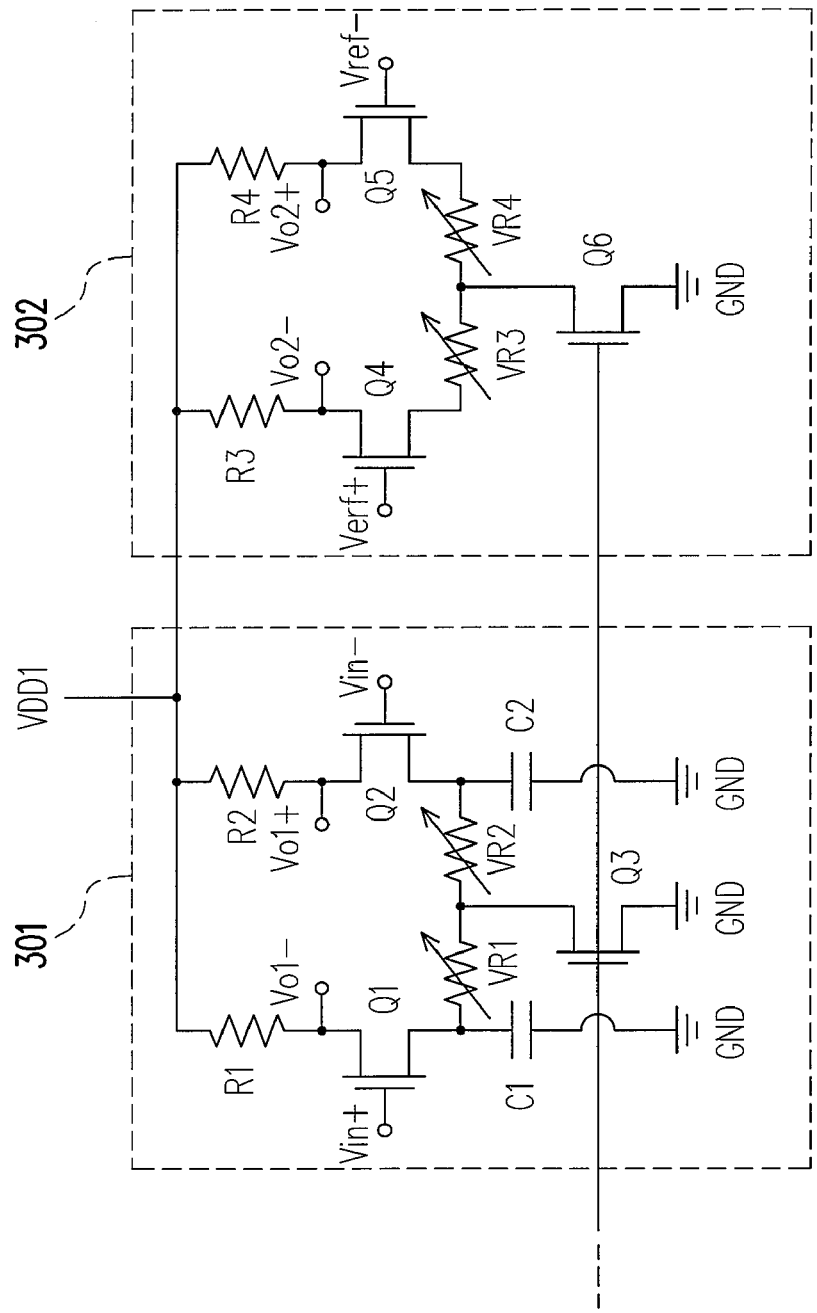
FIG. 5 is an amplifier circuit diagram of FIG. 3.

FIG. 5 is an amplifier circuit diagram of FIG. 3. According to an embodiment of the present invention, the NRZ data signal Vin and the reference voltage Vref are differential signals. The data signal is constituted of a positive signal Vin+ and a negative signal Vin−, and the reference signal is constituted of a positive signal Vref+ and a negative signal Vref−. Similarly, the amplified data signals Vo1 and reference voltage Vo2 are also differential signals, each of which being constituted of a positive signal and a negative signal thereof respectively.

The amplifier 301 includes transistors Q1 to Q3, capacitors C1 and C2, resistors R1 and R2, and variable resistors VR1 and VR2. The resistor R1 is coupled to a voltage source VDD1. The transistor Q1 is coupled to the resistor R1. The variable resistor VR1 is coupled to the transistor Q1. The resistor R2 is coupled to the voltage source VDD1. The transistor Q2 is coupled to the resistor R2. The variable resistor VR2 is coupled to the transistor Q2. The transistor Q3 includes an end coupled to the variable resistors VR1 and VR2, and another end coupled to a ground GND. The transistor Q1 has a gate receiving the positive data signal Vin+, and the transistor Q2 has a gate receiving the reverse data signal Vin−. The transistor Q1 has a drain outputting an amplified reverse data signal Vo1−, and the transistor Q2 has a drain outputting an amplified positive data signal Vo1+.

The amplifier 302 includes transistors Q4 to Q6, resistors R3 and R4, and variable resistors VR3 and VR4. The resistor R3 is coupled to the voltage source VDD1. The transistor Q4 is coupled to the resistor R3. The variable resistor VR3 is coupled to the transistor Q4. The resistor R4 is coupled to the voltage source VDD1. The transistor Q5 is coupled to the resistor R4. The variable resistor VR4 is coupled to the transistor Q5. The transistor Q6 includes an end coupled to the variable resistors VR3 and VR4, and another end coupled to the ground GND. The transistor Q4 has a gate receiving the positive data signal Vref+, and the transistor Q5 has a gate receiving the reverse data signal Vref−. The transistor Q4 has a drain outputting an amplified reverse data signal Vo2−, and the transistor Q5 has a drain outputting an amplified positive data signal Vo2+.

The transistor Q3 of the amplifier 301 and the transistor Q6 of the amplifier 302 belong to a same current mirror structure which is not completely illustrated in its entirety in FIG. 5.

Direct current data signals Vin cannot pass the capacitors C1 and C2. In this manner, circuits of respectively amplifiers 301 and 302 are identical with respect to direct current data signals Vin. The data signal Vin and the reference voltage Vref pass equivalent paths, during which there is no level added thereto. As such, the comparison between Vin and Vref is accurate. With respect to alternating current data signals, the capacitors C1 and C2 are conductive, so that the amplifier 301 takes advantage of zero-peaking so as to solve the problem of output voltage droop of the peak detector. As such, the comparison between Vin and Vref is still accurate. It should be noted that the zero-peaking amplifier can be realized in many approaches, and the one as shown in FIG. 5 is only exemplified for illustration. However, any of the others applied according to the present invention should be construed within the scope of the present invention.

Figure 6:
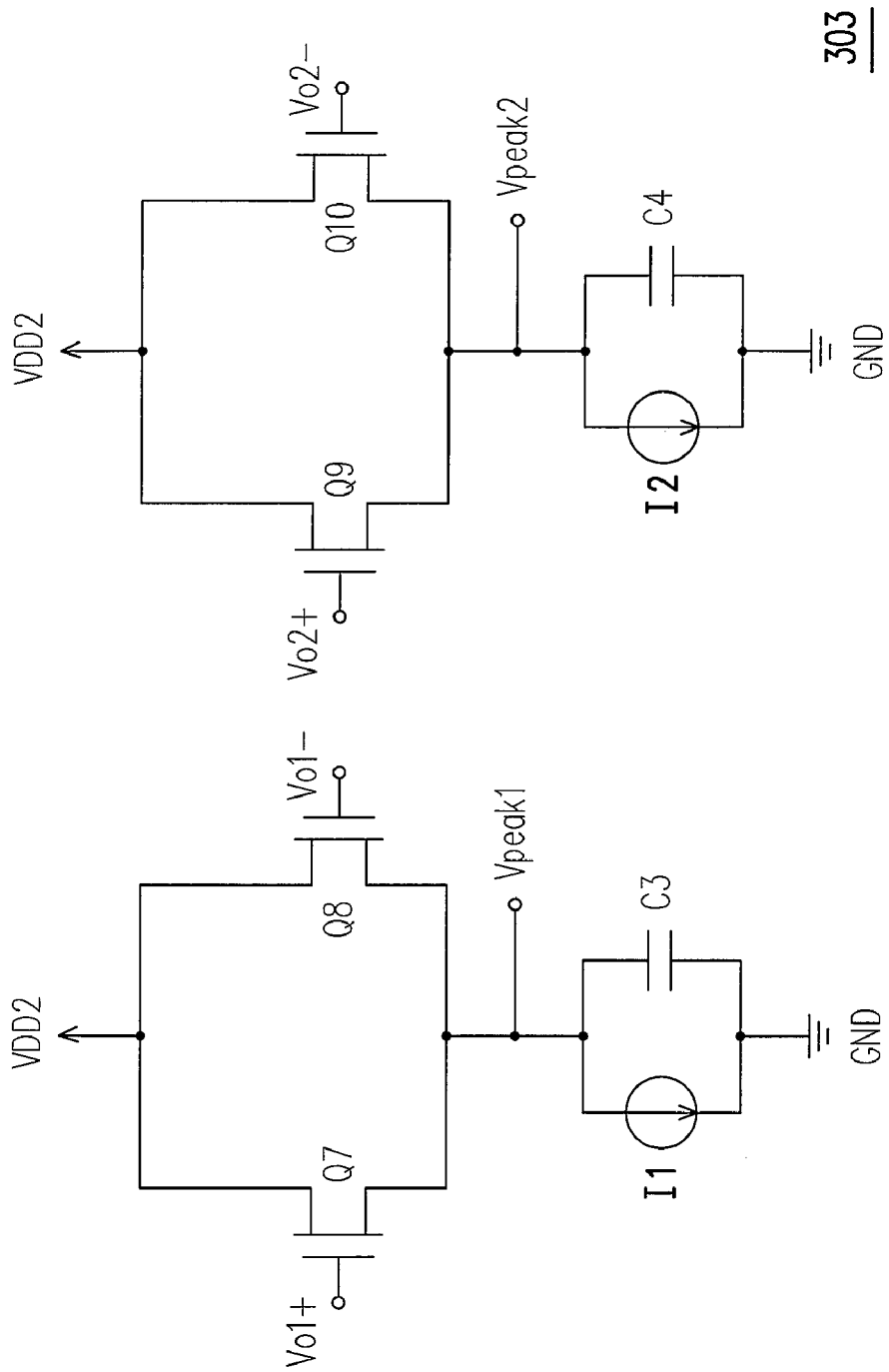
FIG. 6 is peak detector circuit diagram of FIG. 3.

FIG. 6 is a circuit diagram of the peak detector 303. The peak detector 303 includes two identical sections, left and right. The left section is used for processing the amplified data signal Vo1, and the right section is used for processing the amplified reference voltage Vo2.

The left section of the peak detector 303 includes transistors Q7, Q8, a current source I1, and a capacitor C3. The transistor Q7 is coupled to a voltage source VDD2. The transistor Q8 is coupled to the voltage source VDD2 and the transistor Q7. The current source I1 has an end coupled to a common source electrode of the transistors Q7 and Q8, and another end coupled to the ground GND. The capacitor C3 has an end coupled to the common source electrode of the transistors Q7 and Q8, and another end coupled to the ground GND. The capacitor C3 and the current source I1 are connected in parallel. A gate of the transistor Q7 receives the amplified positive data signal Vo1+, and a gate of the transistor Q8 receives the amplified reverse data signal Vo1−. The peak detector 303 relies on the capacitor C3 to maintain the maximum value of the amplified data signal Vo1. A maintained data signal Vpeak1 is outputted from a connection node of the common source electrode of the transistors Q7 and Q8 and the capacitor C3.

The right section of the peak detector 303 includes transistors Q9, Q10, a current source I2, and a capacitor C4. The transistor Q9 is coupled to the voltage source VDD2. The transistor Q10 is coupled to the voltage source VDD2 and the transistor Q9. The current source I2 has an end coupled to a common source electrode of the transistors Q9 and Q10, and another end coupled to the ground GND. The capacitor C4 has an end coupled to the common source electrode of the transistors Q9 and Q10, and another end coupled to the ground GND. The capacitor C4 and the current source I2 are connected in parallel. A gate of the transistor Q9 receives the amplified positive reference voltage Vo2+, and a gate of the transistor Q10 receives the amplified reverse reference voltage Vo2−. The peak detector 303 relies on the capacitor C4 to maintain the maximum value of the amplified reference voltage Vo2. A maintained reference voltage Vpeak2 is outputted from a connection node of the common source electrode of the transistors Q9 and Q10 and the capacitor C4.

Figure 2:
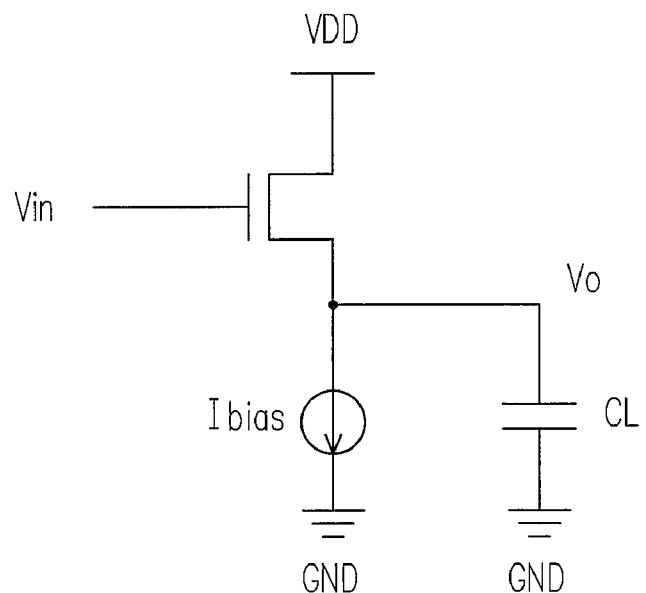
FIG. 2 is a part of a circuit diagram of a conventional peak detector.

The peak detector 303 can lower the frequency of the data signal Vin, so as to enable the comparator 304 to compare data Vin which are of a high frequency, thus increasing the operable frequency bandwidth. Distinct from the conventional single-end design as shown in FIG. 2, the peak detector 303 according to the present invention is designed to be a differential full wave rectifier with pairs of transistors. This peak full wave rectifier design is featured in that it is functionally operable to compare both of the positive semi-cycle and the negative semi-cycle of the differential signal when the data signal Vin changes status, so as to solve the problem of voltage droop caused by conventional peak detectors.

According to an aspect of the present invention, all of the transistors employed are metal oxide semiconductor field effect transistors (MOSFET). However, this is not to exclude other kinds of transistors to be used in the present invention.

In summary, a path of a direct current data signal and a path of the reference voltage are completely symmetrical configured. As such, the present invention is accurate in comparing direct current data signals. In another hand, the zero-peaking amplifier generates relatively large gain for alternating current data signals for compensating voltage droop caused by the peak detector. The peak detector according to the present invention is designed with a full wave rectifier, so as to be capable of comparing both of the positive semi-cycle and the negative semi-cycle of the differential signal. Therefore, the present invention would not cause misjudgement when comparing alternating current data signals.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A signal comparison circuit, comprising:
   a first amplifier, receiving and amplifying a data signal, wherein the first amplifier is a zero-peaking amplifier;
   a second amplifier, receiving and amplifying a reference voltage, wherein the data signal passes through a first path in the first amplifier and the reference voltage passes through a second path in the second amplifier, the first path and the second path are equivalent;
   a peak detector, coupled to the first amplifier and the second amplifier, detecting and maintaining maximum values of respectively the amplified data signal and the amplified reference voltage and outputting the maintained data signal and the maintained reference voltage; and
   a comparator, coupled to the peak detector for comparing the maintained data signal with the maintained reference voltage, and outputting a comparison result therefrom,
   wherein a maximum gain of the first amplifier for the data signal is located according to a data transmission rate of the data signal and the first amplifier generates the maximum gain for compensating output voltage droop of the peak detector caused by internal current leakage of the peak detector.

2. The signal comparison circuit according to claim 1, wherein the data signal and the reference voltage are differential signals.

3. The signal comparison circuit according to claim 2, wherein the first amplifier comprises:
   a first transistor, coupled to a first voltage source;
   a second transistor, coupled to the first voltage source;
   a third transistor, coupled between the first transistor, the second transistor, and a ground terminal;
   a first capacitor, coupled between the first transistor, the third transistor, and the ground terminal; and
   a second capacitor, coupled between the second transistor, the third transistor, and the ground terminal; wherein
   a gate of the first transistor receives a positive signal of the data signal;
   a gate of the second transistor receives a negative signal of the data signal;
   a drain of the first transistor outputs a negative signal of the amplified data signal;
   a drain of the second transistor outputs a positive signal of the amplified data signal;
   the first and the second capacitors block direct current signals and conduct alternating current signal so that the first amplifier has zero-peaking characteristics and compensates the output voltage droop of the peak detector.

4. The signal comparison circuit according to claim 3, wherein a first end of the first capacitor is coupled between the first transistor and the third transistor; a second end of the first capacitor is coupled to the ground terminal; a first end of the second capacitor is coupled between the second transistor and the third transistor; and a second end of the second capacitor is coupled to the ground terminal.

5. The signal comparison circuit according to claim 3, wherein the first amplifier further comprises:
   a first resistor, coupled between the first voltage source and the first transistor; and
   a second resistor, coupled between the first voltage source and the second transistor.

6. The signal comparison circuit according to claim 3, wherein the first amplifier further comprises:
   a first variable resistor, coupled between the first transistor and the third transistor; and
   a second variable resistor, coupled between the second transistor and the third transistor.

7. The signal comparison circuit according to claim 2, wherein the second amplifier comprises:
   a fourth transistor, coupled to a first voltage source;
   a fifth transistor, coupled to the first voltage source; and
   a sixth transistor, coupled between the fourth transistor, the fifth transistor, and a ground terminal; wherein
   a gate of the fourth transistor receives a positive signal of the reference voltage;
   a gate of the fifth transistor receives a negative signal of the reference voltage;
   a drain of the fourth transistor outputs a negative signal of the amplified reference voltage; and
   a drain of the fifth transistor outputs a positive signal of the amplified reference voltage.

8. The signal comparison circuit according to claim 7, wherein the second amplifier further comprises:
   a third resistor, coupled between the first voltage source and the fourth transistor; and
   a fourth transistor, coupled between the first voltage source and the fifth transistor.

9. The signal comparison circuit according to claim 7, wherein the second amplifier further comprises:
   a third variable resistor, coupled between the fourth transistor and the sixth transistor; and
   a fourth variable resistor, coupled between the fifth transistor and the sixth transistor.

10. The signal comparison circuit according to claim 2, wherein the peak detector employs a capacitor for maintaining the maximum values of the amplified data signal and the amplified reference voltage.

11. The signal comparison circuit according to claim 10, wherein the peak detector comprises:
    a seventh transistor, coupled to a second voltage source;
    an eighth transistor, coupled to the second voltage source and the seventh transistor;
    a first current source, coupled between the seventh transistor, the eighth transistor, and a ground terminal; and a third capacitor, coupled between the seventh transistor, the eighth transistor, and the ground terminal, and connected in parallel with the first current source; wherein a gate of the seventh transistor receives a positive signal of the amplified data signal;

a gate of the eighth transistor receives a negative signal of the amplified data signal;

a common source of the seventh transistor and the eighth transistor outputs the maintained data signal.

12. The signal comparison circuit according to claim 10, wherein the peak detector comprises:

a ninth transistor, coupled to a second voltage source;

a tenth transistor, coupled to the second voltage source and the ninth transistor;

a second current source, coupled between the ninth transistor, the tenth transistor and a ground terminal; and a fourth capacitor, coupled between the ninth transistor, the tenth transistor, and the ground terminal, and connected in parallel with the second current source; wherein a gate of the ninth transistor receives a positive signal of the amplified reference voltage;

a gate of the tenth transistor receives a negative signal of the amplified reference voltage;

the common source of the ninth transistor and the tenth transistor outputs the maintained reference voltage.

13. The signal comparison circuit according to claim 1, wherein the data signal is a not-return-to-zero (NRZ) data signal.

* * * * *